(12) United States Patent
Seko

(10) Patent No.: US 6,222,866 B1
(45) Date of Patent: *Apr. 24, 2001

(54) SURFACE EMITTING SEMICONDUCTOR LASER, ITS PRODUCING METHOD AND SURFACE EMITTING SEMICONDUCTOR LASER ARRAY

(75) Inventor: Yasuji Seko, Nakai-machi (JP)

(73) Assignee: Fuji Xerox Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,624

(22) Filed: Dec. 29, 1997

(30) Foreign Application Priority Data

Jan. 6, 1997 (JP) ...................................... 9-000233

(51) Int. Cl.⁷ ................................. H01S 5/42; H01S 5/187
(52) U.S. Cl. ................................. 372/50; 372/45; 372/96; 438/43; 438/44
(58) Field of Search .......................... 372/50, 96, 43–46; 438/43, 44

(56) References Cited

U.S. PATENT DOCUMENTS

| | | | |
|---|---|---|---|
| 4,532,694 | * 8/1985 | Kolbas | 438/23 |
| 5,031,187 | * 7/1991 | Orenstein et al. | 372/50 |
| 5,062,115 | * 10/1991 | Thornton | 372/50 |
| 5,163,064 | * 11/1992 | Kim et al. | 372/50 |
| 5,466,633 | * 11/1995 | Ackley et al. | 438/34 |
| 5,528,615 | * 6/1996 | Shima | 372/45 |
| 5,701,321 | * 12/1997 | Hayafuji et al. | 372/44 |

FOREIGN PATENT DOCUMENTS

| | | | |
|---|---|---|---|
| 57-198689A | * 12/1982 | (JP) | 372/50 |
| 63-168068A | * 7/1988 | (JP) | 372/50 |
| 4-226093 | 8/1992 | (JP) . | |
| 5-226778 | 9/1993 | (JP) . | |

OTHER PUBLICATIONS

G.M. Yang, ,M.H. MacDougal and P..D. Dapkus, "Ultralow threshold current vertical–cavity surface–emitting lasers obtained with selective oxidation", Electronics Letters, vol. 31, No. 11, May 25, 1995, pp. 886–888.

R.A. Morgan et al., "Two–Dimensional Matrix Addressed Vertical Cavity Top–Surface Emitting Laser Array Display", IEEE Photonics Technology Letters, vol. 6, No. 8, Aug. 1994, pp. 913–917.

\* cited by examiner

Primary Examiner—Rodney Bovernick
Assistant Examiner—Michael J Stahl
(74) Attorney, Agent, or Firm—Oliff & Berridge, PLC

(57) ABSTRACT

A surface emitting semiconductor laser comprises a semiconductor multilayer reflecting film of a first conductivity type, a quantum well active layer having at least one quantum well structure, a semiconductor multilayer reflecting film of a second conductivity type and a contact layer of the second conductivity type sequentially stacked in a layered manner inside a concavity formed on a surface of a semiconductor substrate. The contact layer of the second conductivity type is formed in a buried manner so that the surface of the contact layer is approximately flush with the surface of the semiconductor substrate. A second electrode is formed on a part of the surface of the contact layer other than a part left for forming a light guiding region thereon.

11 Claims, 9 Drawing Sheets

SURFACE EMITTING SEMICONDUCTOR LASER, ITS PRODUCING METHOD AND SURFACE EMITTING SEMICONDUCTOR LASER ARRAY

BACKGROUND OF THE INVENTION

1. Field of the Invention

The present invention relates to a surface emitting semiconductor laser used as a light source for optical communication, an optical recording apparatus, a laser printer or the like, a method of producing the same and a surface emitting semiconductor laser array.

2. Related Prior Art

As a relatively simple and easy method of producing a surface emitting laser, there has been proposed a method in which a surface emitting laser structure layer is stacked on a flat GaAs substrate and thereafter ions (protons) are injected into a region, where a current is not made to flow, to make the region electrically insulated, a active region is defined and a current constriction structure is formed (Japanese Published Unexamined Patent Application No. Hei 4-226093).

This method has a fault that, while a surface of an element is flat and an electrode and the like are easy to be formed, an optical wave guiding (index guiding) structure which is important in a laser structure is not formed. This laser is called a gain guiding surface emitting laser but laser characteristics are low, for example, a threshold current is high, a quantum efficiency is low and the like. Besides, it has a problem of a thermal lens effect that a micro fluctuation of a refractive index arises in the bulk of a laser under influence of heat generation and such a micro fluctuation causes gradual increase in an optical output, so that the output is hard to be constant. Moreover, it has another problem that it is required that a bias current is always made to flow in order to realize a high speed modulation, so that power consumption is large.

As a method of forming a current constriction structure without usage of proton implantation or the like, there has been proposed a method in which a surface emitting laser structure layer is formed in a layered manner on a surface of a substrate processed in a concave shape (Japanese Published Unexamined Patent Application No. Hei 5-226778).

This method is to utilize a phenomenon that a silicon doped layer grown on a (111) oriented surface of a substrate which is processed in a concave profile whose bottom is in the shape of a flat regular triangle comprises n-type and p-type layers respectively grown on the two kinds of surface, that is flat and sloped surfaces. That is to say, after a n-type multilayer mirror is grown, a n-type active layer is grown. Since an active layer on the flat surface is of n-type and that on the sloped surface is of p-type, an active layer is surrounded by a pn junction in a lateral direction. A surface emitting laser structure is completed by growing a p-type multilayer mirror thereon.

Even in this method, in the same way as that of the above mentioned example, an index guiding structure is not formed but a gain guiding surface emitting laser is formed, so that there is a problem that laser characteristics are low.

In this structure, since a region of a pn junction which has the minimum band gap is a corner region between the flat and sloped surfaces of the active layer, an electron and a hole are subjected to recombination to emit light. In the case of a surface emitting laser, since recombination desirably occurs in the middle portion of the flat surface, there arises a problem that a laser of this structure has low characteristics.

There has been proposed an index guiding laser to solve a problem of a gain guiding laser (Electronics Letters, Vol. 31, No. 11, 1995, pp. 886 to 888). This laser has a current constriction structure and a light wave guiding structure formed by selectively oxidizing only an AlAs layer inserted near an active layer to make it electrically isolated. After growth of a laser structure on a GaAs substrate 1, a circular cylinder of 100 μm to 10 μm in diameter or an angular prism of a similar size is formed in a protruding manner by etching to expose a sectional surface of an AlAs layer. Thus etched substrate is heated in a water vapor atmosphere to oxidize the AlAs layer on the outer side surface thereof. An oxidation of the AlAs layer advances from the outer side surface of the circular cylinder or angular prism to the center thereof while an oxide is formed in a doughnut shape. An oxidizing AlAs forms aluminum oxide 18. This has a high insulating property and thereby blocks a current, so that a current flows only through an aperture of an unoxidized region in a doughnut-shaped aluminum oxide. Since aluminum oxide has a low refractive index and thus there is formed a light wave guide along a light emitting direction (a longitudinal direction), the light wave guide being a region of the aperture of the doughnut working as a core. This structure is shown in FIG. 7. In this laser element, a current is made to flow between an n-type electrode 13 formed on a rear side of a n-type substrate and a p-type electrode 12 formed on a top end surface of the laser.

An index guiding surface emitting laser using such selective oxidation of AlAs has excellent laser characteristics such as a low threshold current, high quantum efficiency, good high speed modulation property and the like. However, since the circular cylinder or angular prism is as high as 3 μm or more in a protruding manner, formation of an electrode on the top end surface is difficult. Moreover, since the top end surface is generally tens of μm square (a circle of tens of μm in diameter) or smaller in area and has a light emitting apparatus opened in the central portion, wire bonding cannot be applied to a metal electrode on the top end surface. For that reason, an interconnect to the electrode is extended over a surface of the substrate and an electrode pad is formed for wire bonding at the other end of the interconnect located in a part other than a part which a laser element occupies. Such a high protrusion is a great disturbance to form an electrode interconnection in its process. There has been a great hardship in film formation for an electrode, coating of resist, exposure to light, electrode etching and the like over a step having a rise of 3 μm or more in a concavity and convexity profile with a good yield.

As described above, a conventional surface emitting laser has suffered from serious problems.

Besides, in the case of a matrix interconnection surface emitting laser array, such problems are more serious.

The matrix interconnection laser array has a structure wherein surface lasers are two dimensionally arrayed and individual arrays are driven by positive electrodes and negative electrodes interconnected in row and column directions. When a degree a integration of a laser is higher, since individual interconnection of electrodes on lasers cannot be realized, matrix interconnection becomes necessary. In matrix interconnection, grooves of several μm or more in depth have to be formed by etching in gaps between adjacent columns of lasers in order that they are electrically isolated between any adjacent two thereof regardless of a gain guiding structure or a index guiding structure. Negative electrodes are formed in parallel to the grooves and positive electrodes are formed on the negative electrodes in directions perpendicular to the array columns with an insulating film interposing between them. It has been found from our experiments that formation of matrix interconnection on such a deep concavity and convexity profile is a very difficult task.

Even in the most advanced LSI process, a depth of a concavity and convexity profile is generally on the order of 1 μm. There has been no proposal of a technique in which interconnection of electrodes are formed across a surface having a concavity and convexity profile and as can be seen from such circumstances, such a electrode interconnection technique is extremely difficult. As a matrix interconnection surface emitting laser array, an example in which a surface emitting laser is fabricated by matrix interconnection with ion implantation has been proposed (AT & T Bell Laboratories, IEEE Photonics Technology Letters, Vol., No. 8, August 1994, pp. 913 to 917). Ion implantation is applied to an upper side mirror to form a current constriction structure, then the laser structure is etched off to a depth of several μm up to the vicinity of the lowest layer thereof and a residual layer is further electrically isolated by ion implantation. Thereafter, as shown in FIG. 8, positive and negative electrodes are formed by matrix interconnection.

In this case, while a gap between each adjacent column of a laser array is insulated by ion implantation, since a depth, to which insulation can be achieved by ion implantation, is on the order of 4 μm, a depth of several μm has to be removed by etching, so that there is still a concavity and convexity profile of the order in the range of 3 to 5 μm on the surface. It is extremely difficult to form negative and positive electrodes by matrix interconnection over a surface having a depth in a concavity and convexity profile. That is to say, since an accuracy in patterning by photolithography cannot sufficiently be achieved in an actual fabrication process, there arises with ease a short between electrodes, breaking of interconnection, remaining of resist and the like, which makes it very difficult to fabricate a good laser array. While, according to the teachings of the article, an array pitch of the laser array is 140 μm in both row and column directions, if the pitch is narrowed to tens of μm the matrix interconnection is more difficult with an increased extremity, which makes it possible to form the matrix interconnection by this method.

Especially, when an index guiding surface emitting laser is integrated, a protruding profile such as a circular cylinder and angular prism is formed on a laser in order to conduct oxidation of AlAs and the like and then etching has to be applied to remove up to the lowest layer of a laser array in order to achieve electrical insulation of the laser array. It is extremely difficult to form a matrix interconnection on a surface of a concavity and convexity profile in such a deep and complicated manner like this. When an array pitch of the laser array is narrowed to tens of μm, difficulty is further increased.

As mentioned above, there have been problems that a conventional surface emitting laser having a flat front surface is a gain guiding laser without a light wave guide and its laser characteristics are low.

On the other hand, an index guiding surface emitting laser has a deep concavity and convexity profile on the surface of an element and further hardship in formation of electrode interconnection and the like.

In addition, a conventional matrix interconnection surface emitting laser array has also a problem that since a deep concavity and convexity profile is produced by an etched groove which works as insulation between laser arrays, matrix interconnection over the profile is extremely difficult.

SUMMARY OF THE INVENTION

The present invention has been made in light of the above situation, and has an object to provide a surface emitting semiconductor laser excellent in emitting characteristics, high in processing accuracy and high in reliability.

According to a first aspect of the present invention, a surface emitting semiconductor laser of the present invention comprises: a semiconductor multilayer reflecting film of a first conductivity type, a quantum well active layer having at least one quantum well structure, a semiconductor multilayer reflecting film of a second conductivity type and a contact layer of the second conductivity type sequentially stacked in a layered manner inside a concavity formed on a surface of a semiconductor substrate in order to form the surface emitting semiconductor laser, wherein the contact layer of the second conductivity is formed in a buried manner so that the surface of the contact layer of the second conductivity type is approximately flush with the surface of the semiconductor substrate and a second electrode formed on a part of the surface of the contact layer of the second conductivity type located at the surface of stacked layers in the concavity other than a part left for forming a light guiding region thereon.

According to a second aspect of the present invention, a method of producing a surface emitting semiconductor laser of the present invention comprises the steps of: forming a concavity defined by a bottom surface of a predetermined area and a sloped sidewall, which has a profile in such a manner that an area of an opening is larger toward the surface side from the bottom, on a surface of a semiconductor substrate of a first conductivity type; sequentially stacking a contact layer of the first conductivity, a semiconductor multilayer reflecting film of the first conductivity type, a quantum well active layer having at least one quantum well structure, a semiconductor multilayer reflecting film of a second conductivity type, and a contact layer of the second conductivity type in such a manner that the concavity is at least covered, so that a semiconductor laser layer is formed, wherein the semiconductor laser layer is buried in the concavity so that a surface of the contact layer of the second conductivity type is approximately flush with the surface of the semiconductor substrate; and forming a second electrode having an opening used for a light guiding region on the surface of the contact layer of the second conductivity located on the surface of stacked layers inside the concavity.

According to a third aspect of the present invention, a surface emitting semiconductor laser array of the present invention comprises: a plurality of concavities defined by a bottom surface of a predetermined area and a sloped sidewall, which has a profile in such a manner that an area of an opening is larger toward the surface side from the bottom, the concavities being formed on a surface of a semiconductor substrate of a first conductivity type and two-dimensionally arrayed thereon; a contact layer of the first conductivity, a semiconductor multilayer reflecting film of the first conductivity type, a quantum well active layer having at least one quantum well structure; a semiconductor multilayer reflecting film of a second conductivity type, and a contact layer of the second conductivity type sequentially stacked in a layered manner in each of the concavities, the contact layer of the second conductivity type being buried in each concavity so that a surface of the contact layer of the second conductivity type is approximately flush with the surface of the semiconductor substrate, whereby a plurality of surface emitting semiconductor lasers are formed in a buried manner, and wherein the contact layer of the first conductivity type located in a depth is made to reach the surface of part of the semiconductor substrate adjacent to the concavity and connected with a first electrode on the surface of the semiconductor substrate, the contact layer of the second conductivity type locates at the surface of stacked layers in each concavity is connected to a second electrode formed on a part of the surface of its own other than a part left for forming a light guiding region thereon, and further the first and second electrodes of each surface emitting semiconductor laser are respectively connected with an interconnection pattern on the surface of the substrate.

According to the first aspect of the present invention, since the surface emitting semiconductor laser is buried in the concavity formed on the surface of the semiconductor substrate of the first conductivity type, there is almost no step between the contact layer of the first conductivity type and a contact layer of the second conductivity type and a flat surface profile can be obtained, so that an interconnection pattern can be achieved with a high accuracy and high reliability.

It is preferred that a sidewall of the concavity is formed to be a sloped surface and, for example the contact layer of the first conductivity type is formed along the sloped surface so as to reach part of the surface of the substrate adjacent to the concavity, so that no disconnection of the contact layer occurs at a step corner and connection can be made with a high reliability.

If a semiconductor layer of a lower refractive index than that of the semiconductor multilayer reflective film of the first conductivity type is interposed at the lower layer side than the quantum well active layer, the effective refractive indexes in upward and downward directions of the bottom of the concavity are larger than those of the sloped surface in a light oscillating region, so that a light wave guiding structure is thus formed to achieve a high efficiency.

If an $Al_xM_{1-x}As$ (M: a group III element, $x \geq 0.9$) layer is interposed and a region of an insulating property having a low refractive index is formed by selective oxidation, light confinement and current constriction can be simultaneously achieved, so that an index guiding structure can be obtained with great ease.

If the semiconductor laser layer is made to be buried in the concavity with an insulating layer formed along the inner sidewall of the concavity interposing therebetween, each element for itself can be isolated from an adjacent element and a potential thereof can be selected independently of that of the substrate, so that high integration can be achieved and at the same time integration with an element of another kind is easy.

Moreover, if an aluminum oxide layer formed by oxidation of an AlAs layer of AlGaAs layer is used as the insulating layer, oxidation can be conducted after an epitaxial growth of a semiconductor layer in a element region is finished, so that the insulating layer can be interposed without any disturbance in the epitaxial growth.

According to a method of the present invention, a surface emitting semiconductor laser with a high reliability can be fabricated with great ease.

If the step of forming the concavity is desirably conducted in such conditions that etching selectively is exercised in dependence on a crystallographic orientation of the semiconductor substrate, the etching being anisotropic etching which controls so that the sloped surface constitutes a specific crystallographic plane, the concavity can be formed with an extremely high reproducibility.

For example, the semiconductor substrate is a (100) oriented GaAs substrate or (111) A oriented GaAs substrate and etching is controlled in a anisotropic etching step so that the sidewall surface may have a (111) A orientation. If a (111) A oriented GaAs substrate is etched by use of a $H_2SO_4 \cdot H_2O_2 \cdot H_2O$ mixed solution, a (111) A oriented crystallographic plane is exposed as a surface which plane has the slowest etching rate, a bottom is formed in the shape of a regular triangle, and sidewalls are formed so as to be constituted with surfaces each of a crystallographic plane equivalent to a (111) A crystallographic plane, the crystallographic plane being inclined to a surface of the bottom at an angle of 70.6°. The concavity is thus formed so that an opening thereof is enlarged toward the surface of the substrate. If a (100) oriented GaAs substrate is etched by the mixed solution, a groove structure can be formed in an extended shape along a <01-1> orientation having a (111) A oriented surface as each of sidewalls. In this case, a (111) A surface of each of the sidewalls is inclined at an angle of 54.7° to a (100) oriented bottom surface. If etching conditions are selected in such a way, the crystallographic orientation of a sidewall can be controlled with a high accuracy.

According to the third aspect of the present invention, high integration can be realized and thus a two-dimensional laser device with a high reliability can be obtained.

If a contact layer of the first conductivity is insulated, insulation in each region between any adjacent concavities can be achieved with ease.

If a semiconductor laser layer is buried in a concavity with an insulating layer interposing therebetween, the semiconductor substrate and the semiconductor laser layer can easily be isolated by insulation from each other, so that integration can be realized.

DETAILED DESCRIPTION OF THE INVENTION

Below, the present invention will be described in reference to the accompanying drawings.

Figure 1:
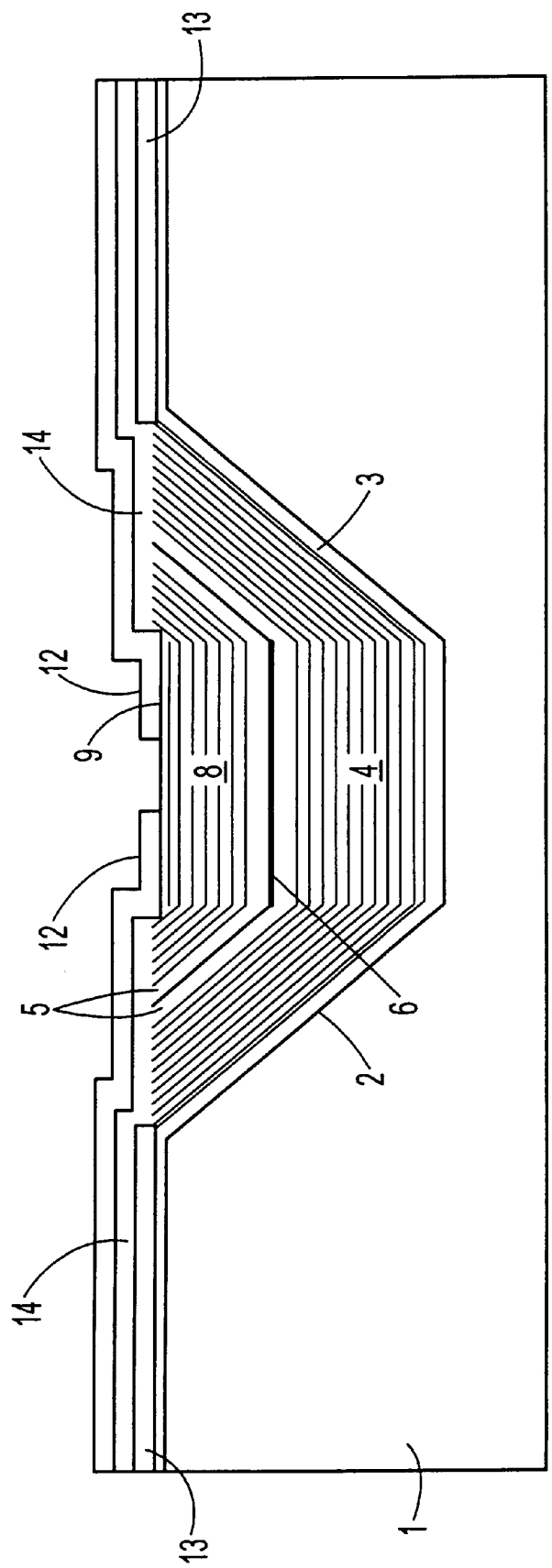
FIG. 1 is a view showing a surface emitting semiconductor laser according to a first embodiment of the present invention.

FIG. 1 is a sectional view of a main portion of a surface emitting semiconductor laser device according to the first embodiment of the present invention and FIGS. 2 (*a*) to 2 (*f*) are views showing the semiconductor laser of FIG. 1 in process steps of fabrication.

The surface emitting semiconductor laser device comprises: a concavity 2 formed in a constricted manner in the shape of a bottom-up truncated quadrangular pyramid with a square bottom surface of a side of 10 µm on a surface of an n-type (100) oriented gallium arsenide (GaAs) substrate 1; an n-type contact layer 3 (a film thickness of 0.3 µm) having a n-type carrier concentration of $2\times10^{18}/cm^3$, an n-type $Al_{0.9}Ga_{0.1}As/Al_{0.3}Ga_{0.7}As$ lower semiconductor multilayer mirror 4 made of 40.5 cycles of a combination of an n-type $Al_{0.9}Ga_{0.1}As$ having an n-type carrier concentration of $1\times10^{18}/cm^3$ and an n-type $Al_{0.3}Ga_{0.7}As$ having the same n-type carrier concentration (film thickness of 64.5 nm/57.6 nm), an undoped $Al_{0.6}Ga_{0.4}As$ spacer layer 5 (a thickness of 179.6 nm) including a quadruple quantum well structure 6 made of 4 cycles of a combination of an $Al_{0.11}Ga_{0.89}As$ well layer/an $Al_{0.3}Ga_{0.7}As$ barrier layer each having a n-type carrier concentration of $2\times10^{18}/cm^3$ (thicknesses of 8.0 nm/5.0 nm) in the middle portion, a p-type $Al_{0.9}Ga_{0.1}As/Al_{0.3}Ga_{0.7}As$ upper semiconductor multilayer mirror 8 made of 26 cycles of a combination of a p-type $Al_{0.9}Ga_{0.1}As$ having a p-type $Al_{0.3}Ga_{0.7}As$ having the same p-type carrier concentration (thicknesses of 64.5 nm/57.6 nm), and a continuous p-type contact layer 9 (a film thickness of 9.0 nm) having a p-type carrier concentration of $3\times10^{18}cm^3$ sequentially stacked in a layered manner in the concavity, wherein stacked layers are buried in the concavity so that a surface of the p-type contact layer 9 is flush with the surface of the substrate 1; an n-type electrode 13 made of AuGe formed so as to be connected to a surface of the p-type contact layer 9 on the upper side.

An upper surface of the n-type electrode 13 is covered for protection by an insulating film 14 made of a silicon oxide film except for a light guiding region and the p-type electrode 12 region thereof.

The n-type $Al_{0.9}Ga_{0.1}As/Al_{0.3}Ga_{0.7}As$ lower semiconductor multilayer reflecting film 4 is formed by stacking about 40.5 cycles of the combination of an n-type $Al_{0.9}Ga_{0.1}As$ and an n-type $Al_{0.3}Ga_{0.7}As$ of respective thicknesses of $\lambda/(4n_r)$, wherein $\lambda$ is an oscillating wavelength and $n_r$ is a refractive index. The p-type $Al_{0.9}Ga_{0.1}As/Al_{0.3}Ga_{0.7}As$ upper semiconductor multilayer reflecting film 8 is formed by stacking 26 cycles of the combination of the layers in absolutely the same way as the lower semiconductor multilayer reflecting film 4. The number of cycles is determined by selecting a direction to the substrate side or to the rear side as a direction of light output and a magnitude of a reflectivity is larger as the number of cycles is increased. Therefore, in this structure, for example, if light is output from the surface of the substrate, it is only requires that the number of cycles in the p-type $Al_{0.9}Ga_{0.1}As/Al_{0.3}Ga_{0.7}As$ upper semiconductor multilayer reflecting film 8 is adjusted to be smaller than that in the n-type $Al_{0.9}Ga_{0.1}As/Al_{0.3}Ga_{0.7}As$ lower semiconductor multilayer reflecting film 4.

Now, process steps in production of the surface emitting semiconductor laser device will be described.

First of all, as shown in FIG. 2 (a),. resist was applied on an n-type (100) oriented gallium arsenide (GaAs) substrate 1 and a square window of a side of 10 µm was formed by photolithography. Then, the substrate was etched in a mixed solution of an aqueous hydrogen peroxide solution, sulfuric acid and water to form a concavity 2 having a square bottom surface of a side of 10 µm. At this time, a sloped surface extending in parallel to a <1–10> orientation of the concavity 2 had an inclination at an angle of 54.7° to the bottom surface and the sloped surface was an (111) A plane. A sloped surface extending in parallel to a <110> orientation is isotropically etched and no specific crystallographic facets were observed thereon. In this case, there was utilized a dependency on a crystallographic plane of etching anisotropy, whereby a specific etched profile can be obtained with a high accuracy.

Figure 2B:
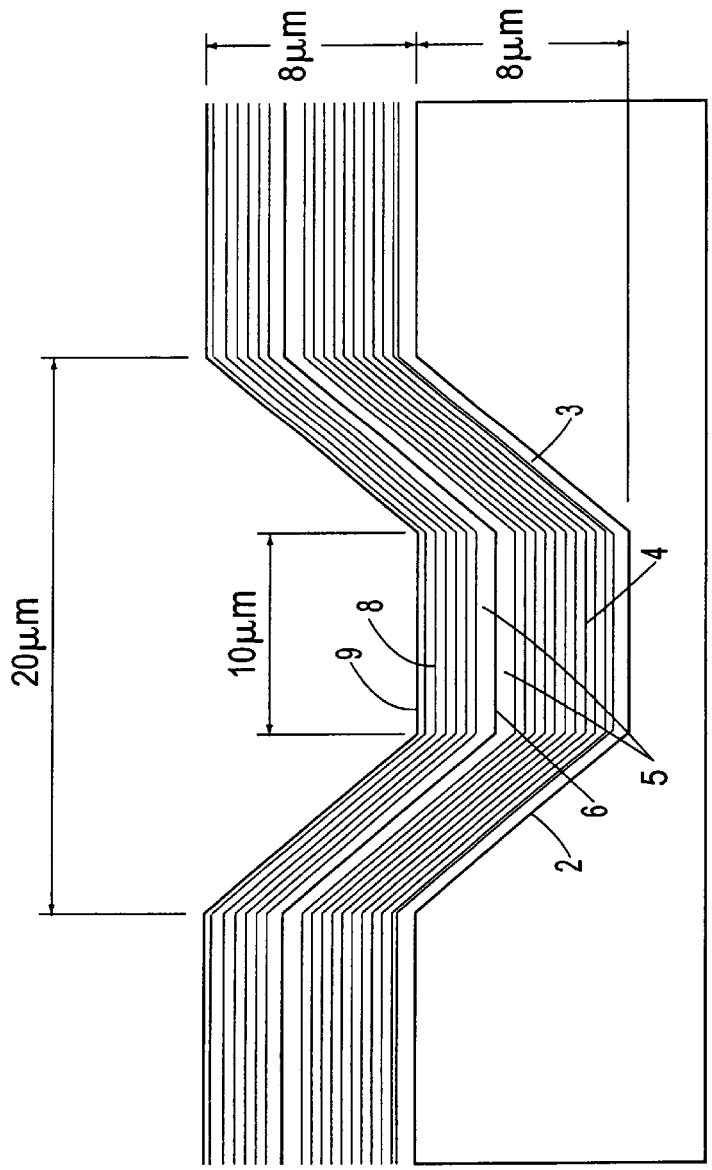
FIGS. 2 (*a*) to 2 (*f*) are views showing the semiconductor laser of FIG. 1 in process steps of production.
Figure 2A:
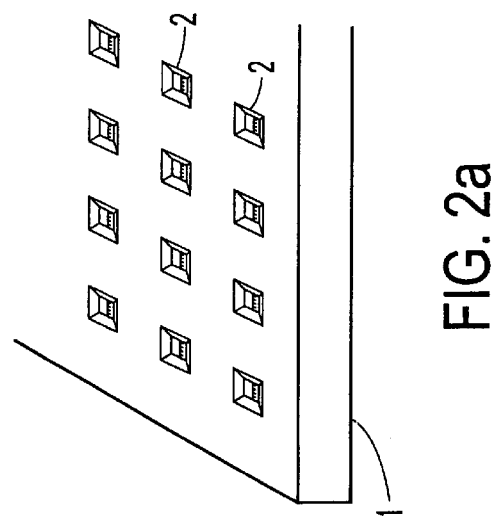
Figure 2C:
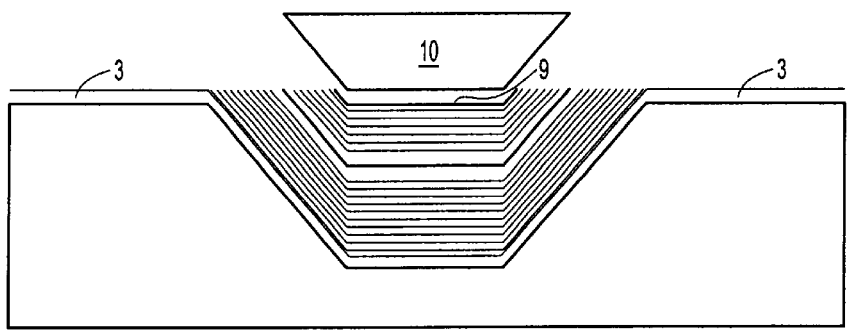
Figure 2D:
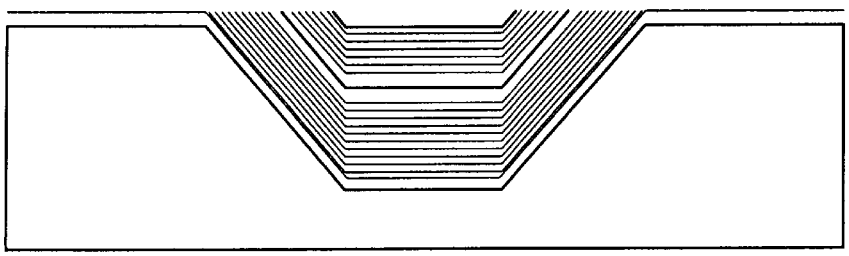
Figure 2E:
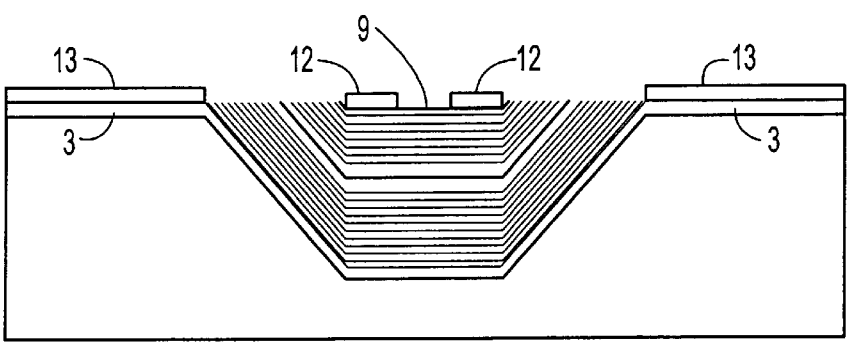
Figure 2F:
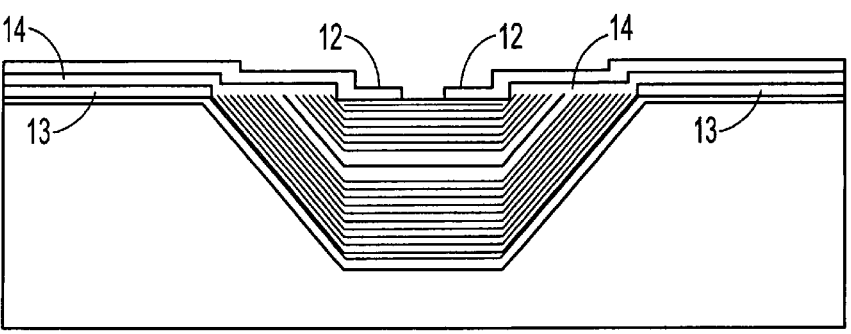

On the substrate 1, as shown in FIG. 2(b), the following layers or films were sequentially applied by means of a metalorganic chemical vapor deposition: an n-type contact layer 3 having a n-type carrier concentration of $2\times10^{18}/cm^3$ of a film thickness of 0.3 µm, an n-type $Al_{0.9}Ga_{0.1}As/Al_{0.3}Ga_{0.7}As$ lower semiconductor multilayer mirror 4 made of 40.5 cycles of a combination of an n-type $Al_{0.9}Ga_{0.1}As$ having an n-type carrier concentration of $1\times10^{18}/cm^3$ and an n-type $Al_{0.3}Ga_{0.7}As$ having the same n-type carrier concentration of respective film thicknesses of 64.5 nm and 57.6 nm, an undoped $Al_{0.6}Ga_{0.4}As$ spacer layer 5 of a thickness of 179.6 nm including a quadruple quantum well structure 6 made of 4 cycles of a combination of an $Al_{0.11}Ga_{0.89}As$ well layer/an $Al_{0.3}Ga_{0.7}As$ barrier layer each having an n-type carrier concentration of $1\times10^{18}/cm^3$ of respective thicknesses of 0.8 nm and 5.0 nm in the middle portion, a p-type $Al_{0.9}Ga_{0.1}As/Al_{0.3}Ga_{0.7}As$ upper semiconductor multilayer mirror 8 made of 26 cycles of a combination of a p-type $Al_{0.9}Ga_{0.1}As$ having a p-type carrier concentration of $1\times10^{18}/cm^3$ and a p-type $Al_{0.3}Ga_{0.7}As$ having the same p-type carrier concentration of respective thicknesses of 64.5 nm and 57.6 nm, and a p-type contract layer 9 having a p-type carrier concentration of $3\times10^{18}/cm^3$ of a film thickness of 9.0 nm.

Thereafter a portion near the bottom of a concavity on the surface of an element was buried with resist 10 and the other portion than that near the bottom was removed by a depth of the order of 8 µm by wet etching to expose the n-type contact layer which is a lower side contact layer (FIG. 2 (c)). Since this layer is a GaAs layer, an etching rate is slow and works as an etching stopper layer.

Then, as shown in FIG. 2 (d), the resist 10 was completely removed. A p-type contact layer of the upper end surface of a laser oscillator has a square shape having a side of 10 µm. A rise of a step between the p-type and n-type contact layers is 1 µm or lower in height.

As shown in FIG. 2 (e), an AuZn film as a p-type electrode 12 was vapor deposited on the p-type contact layer 9 and patterned. An AuGe film as an n-type electrode 13 was vapor deposited and patterned on the n-type contact layer 3. An aperture of a diameter of 4 µm was opened as a light output aperture.

It should be appreciated that the n-type contact layer 3 may be disposed directly on the surface of the semiconductor substrate 1 or interposed in the lower semiconductor multilayer mirror 4.

Thereafter, as shown in FIG. 2 (f), a silicon oxide film was formed and patterned, and subsequently an interconnection electrode was formed, so that a surface emitting semiconductor laser was completed, as has been shown in FIG. 1.

Surface emitting semiconductor laser thus formed has a thickness of a quantum well layer of 8 nm on the bottom side of the concavity and a thickness of about 4 nm on the sloped surface side thereof as is in the above mentioned structure. Therefore, a quantum level is higher on the sloped surface side than on the bottom side, a current is concentrated in the quantum well formed on the bottom side according to such a potential structure, so that a current constriction structure is formed. Here, there is employed such a structure as a thickness of the quantum well layer is set 10 nm or less so as to not only make a quantum well effect conspicuous but also make quantum levels largely different between on the bottom and sloped surface sides. The employment of the structure makes a spread of carriers very small and thereby the carriers are all injected to the quantum layer. The carrier injected into a quantum layer liberates light by an electron hole recombination, the light is reflected by the upper and lower multilayer reflecting films and a laser oscillation occurs when a gain is larger than a loss. Laser light is emitted through a window of the p-side electrode 12 provided on the front surface of a substrate.

In such a manner, a current constriction structure in which a current is concentrated in a quantum well is achieved and thereby very easily obtainable is a surface emitting laser whose surface has a concavity and convexity profile of a step with a small rise. This method has features that the formation is carried out with greater ease, a reproducibility is high with a small dispersion. Therefore, formation of interconnection is very easy and thus patterning can be carried out with a high accuracy.

According to the present invention, since a structure that a surface emitting semiconductor laser is buried in a concavity is employed, a surface profile having a concavity and convexity of a small rise can be obtained, which makes it possible to realize electrode interconnection with a high accuracy and high reliability. Since electrode interconnection can be formed on a plane with a concavity and convexity profile of a small rise, matrix interconnection of positive and negative electrodes, which has conventionally been very difficult, can be conducted with ease.

Moreover, since electrode interconnection can be conducted on a plane with a small rise in step in a concavity and convexity profile, disconnection, short circuit, wrong shape and the like in interconnection can be decreased by a great margin.

Any of film formation of an electrode layer, etching thereof, formation of resist, formation of an insulating film, another etching thereof and the like on a surface with a concavity and convexity profile having a large rise step is unnecessary and thus residual resist and wrong formation of the insulating film can be eliminated, so that a two dimensional array can be formed with high reliability.

Since, only if a laser structure is grown on a crystal surface with a concavity, a current constriction structure in which a current is made to concentrated in a quantum well layer at the bottom can be formed, so that simplification of a process, shortening of time, improvement of a yield and reduction in cost can be achieved.

In the above mentioned embodiment, while an n-type electrode is disposed on the substrate surface side, it may be disposed on the rear side.

Figure 3:
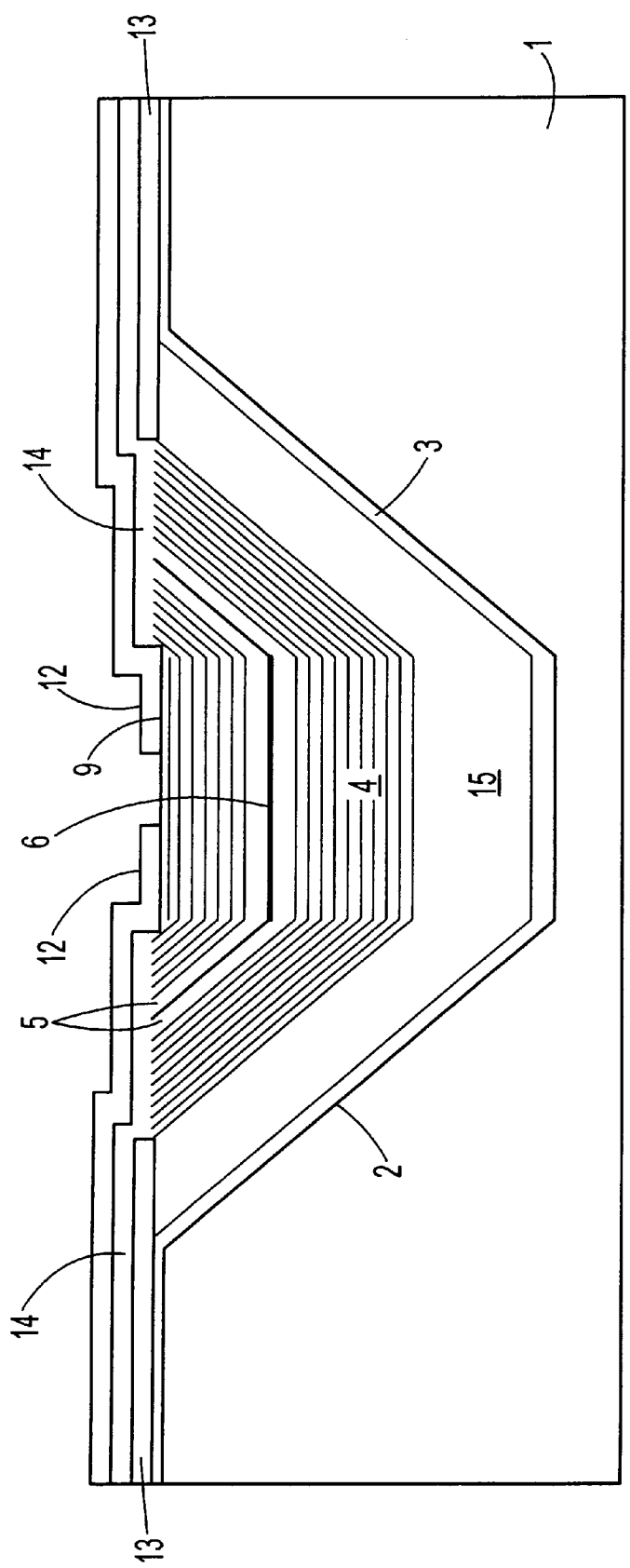
FIG. 3 is a view showing a semiconductor laser device according to a second embodiment of the present invention.

The second embodiment of the present invention will be described with reference to FIG. 3.

In this structure, an n-type $Al_{0.9}Ga_{0.1}As$ layer 15 having a n-type carrier concentration of $1 \times 10^{18}/cm^3$ of a thickness of 2 μm was interposed between the n-type contact layer 3 and the n-type mirror layer 4 to make a region having a low refractive index of the inner wall of the concavity 2 and to adjust an effective refractive index in a direction perpendicular to the bottom smaller than that of the sloped surface in the light oscillating region, so that an index guiding structure was formed. The other regions other than the above mentioned were formed in absolutely the same way as that in the first embodiment.

In production in the second embodiment, it is only required that in a MOCVD process, after the n-type contact layer 3 is formed, the n-type $Al_{0.9}Ga_{0.1}As$ 15 having a n-type carrier concentration of $1 \times 10^{18}/cm^3$ is formed and subsequently the n-type mirror 4 is formed.

According to this structure, in the same way as that of the first embodiment, it is possible to attain a surface emitting semiconductor laser having almost no step rise in a surface concavity and convexity profile, the same effect a that of the first embodiment can be obtained. Besides, since an effective refractive index in the sloped surface is smaller than that in the vertical plane, a light confinement effect to the vertical plane is very good, so that it is possible to form a good index guiding structure.

Figure 4:
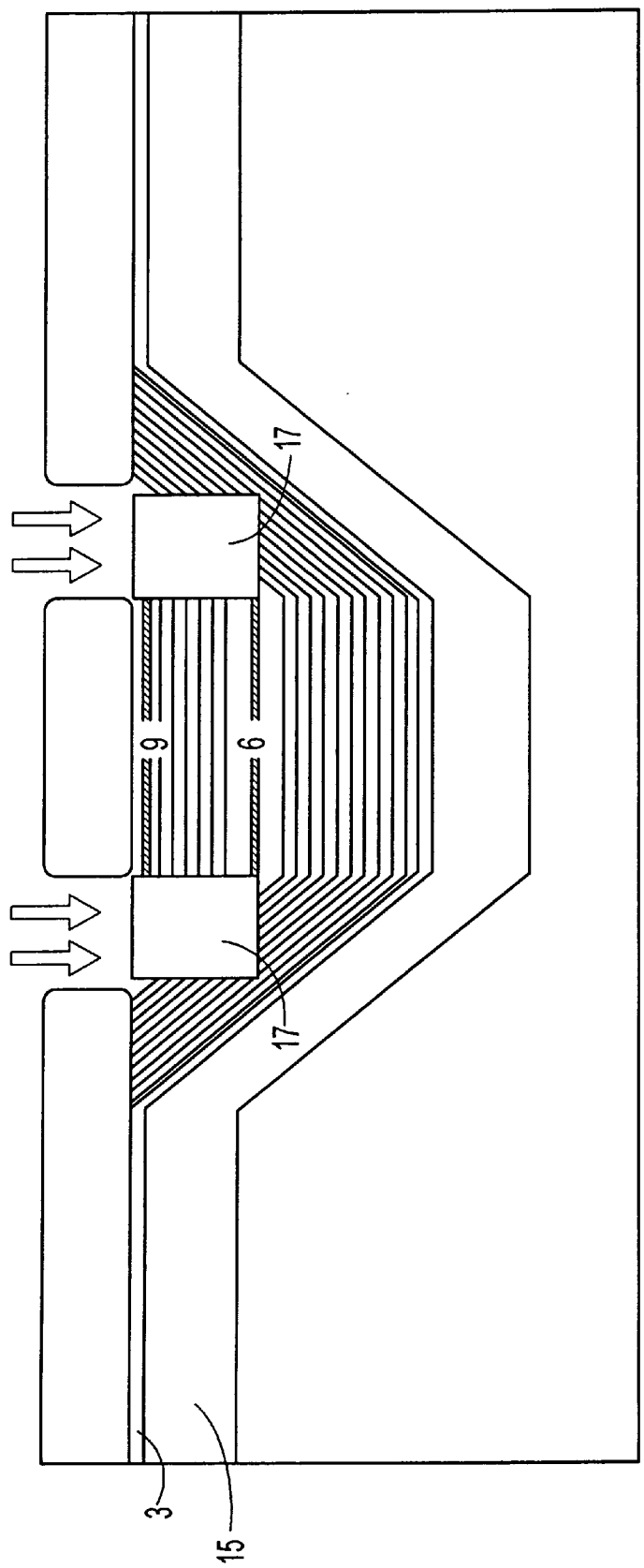
FIG. 4 is a view showing a semiconductor laser according to a third embodiment of the present invention.

The third embodiment of the present invention will be described referring to FIG. 4.

In this structure, in the same way as that in the second embodiment, an n-type $Al_{0.9}Ga_{0.1}As$ layer 15 having a n-type carrier concentration of $1 \times 10^{18}/cm^3$ of a thickness of 2 μm was interposed between the n-type contact layer 3 and the n-type mirror 4, selective ion ($H^+$; proton) implantation was conducted in order to insulate a quantum well layer on a sloped surface of the concavity 2, so that a leakage current in the vicinity of the sloped surface of the concavity 2 can be almost zero with the help of an ion implanted region 17.

In production in the third embodiment, the process of the first embodiment was repeated with addition of steps of: burying a laser forming layer in the concavity 2 shown in FIG. 2 and then conducting proton implantation selectively in the vicinity of the sloped surface and insulating a region near the sloped surface of a concavity 2. The other process was conducted in absolutely the same way as in the second embodiment.

According to this structure, in the same way as that of the first and second embodiments, it is possible to attain a surface emitting semiconductor laser having almost no step rise in a surface concavity and convexity profile and the same effect as those of the first and second embodiments can be obtained. Besides, a leakage current in the vicinity of the sloped surface is almost completely eliminated, so that it is possible to form a good current constriction structure with which a current is injected in the vicinity of the bottom with a good efficiency.

The fourth embodiment of the present invention will be described.

In this structure, selective oxidation to form aluminum oxide is utilized and an insulating property and a low refractive index of thus formed aluminum oxide layer are utilized, so that a surface emitting semiconductor laser with good current constriction and index guiding structures can be obtained.

Figure 5:
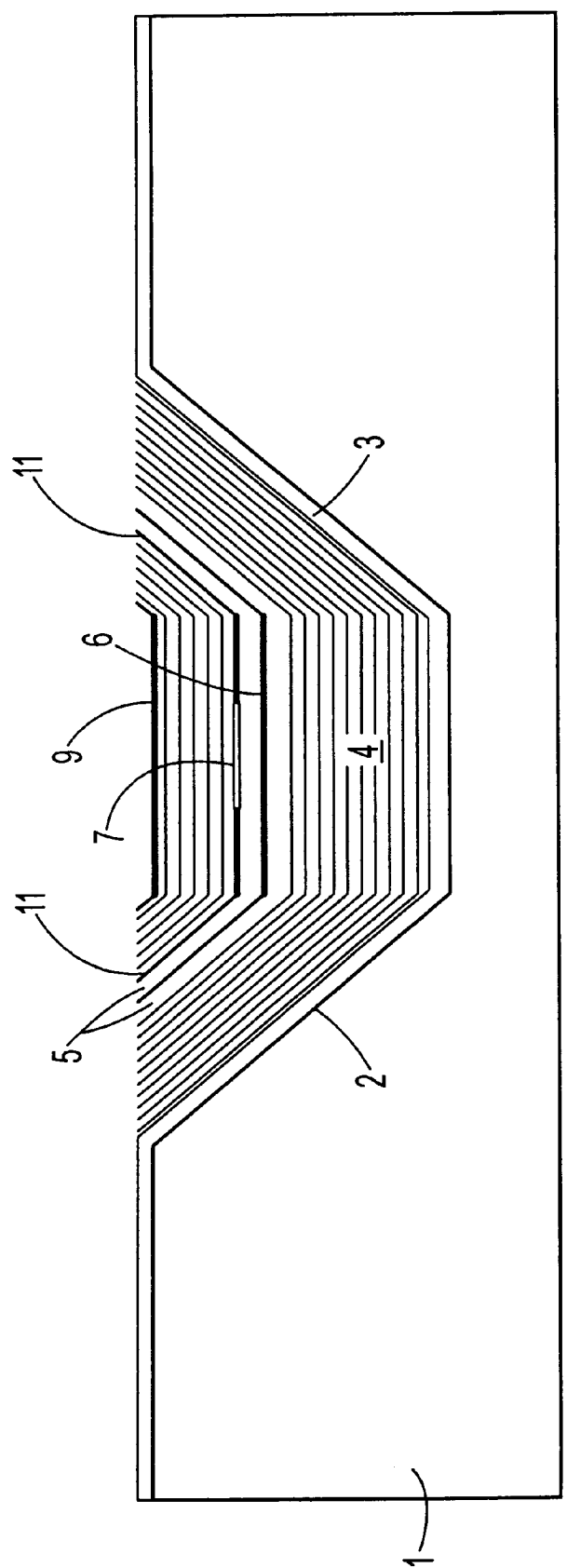
FIG. 5 is a view showing a semiconductor laser according to a fourth embodiment of the present invention.

This surface emitting semiconductor laser device is, as shown in FIG. 5, a device having a surface emitting semiconductor laser formed in a buried manner in a concavity 2 having a regular-triangle shaped bottom of a side of 20 μm formed on an n-type (111) A oriented GaAs substrate 1. A p-type $Al_{0.9}Ga_{0.1}As$ layer (a thickness of 64.5 nm) having a p-type carrier concentration of $1 \times 10^{18}/cm^3$ adjacent to an undoped $Al_{0.1}Ga_{0.8}As$ spacer layer 5 including a quadruple quantum well structure 6 is replaced by a p-type $Al_{0.98}Ga_{0.02}As$ layer 7 having a p-type carrier concentration of $1 \times 10^{18}/cm^3$ and the other regions were formed by stacking and patterning the same semiconductor layers as those of the first embodiment.

In this structure, resist was applied to the surface of the n-type (111)A oriented GaAs substrate 1 and a window in the shape of a regular triangle having a side of 20 μm is formed on the resist by photolithography. Then the substrate 1 was etched by a mixed solution of an aqueous hydrogen peroxide solution, sulfuric acid and water to form a concavity 2 having a regular triangle shaped bottom of a side of 20 μm.

On this occasion, a sloped surface thereof was constituted with a (111)A plane and an inclination angle was about 71 degrees.

On the substrate 1, in the same way as that of the first embodiment, the following layers or films were sequentially in the order by means of a metalorganic chemical vapor deposition: an n-type contact layer 3 having an n-type carrier concentration of $2\times10^{18}/cm^3$ of a film thickness of 0.3 $\mu$m; and n-type $Al_{0.9}Ga_{0.1}As/Al_{0.3}Ga_{0.7}As$ lower semiconductor multilayer reflecting film 4 made of 40.5 cycles of a combination of an n-type $Al_{0.9}Ga_{0.1}As$ having an n-type carrier concentration of $1\times10^{18}/cm^3$ and an n-type $Al_{0.3}Ga_{0.7}As$ having the same n-type carrier concentration of respective film thicknesses of 64.5 nm and 57.6 nm; an undoped $Al_{0.6}Ga_{0.4}As$ spacer layer 5 of a thickness of 179.6 nm including a quadruple quantum well structure 6 made of 4 cycles of a combination of an $Al_{0.11}Ga_{0.89}As$ well layer/an $Al_{0.3}Ga_{0.7}As$ barrier layer of respective thicknesses of 8.0 nm and 5.0 nm in the middle portion; a p-type $Al_{0.9}Ga_{0.1}As/Al_{0.3}Ga_{0.7}As$ upper semiconductor multilayer reflecting film 8 made of 26 cycles of a combination of a p-type $Al_{0.9}Ga_{0.1}As$ having a p-type carrier concentration of $1\times10^{18}/cm^3$ and a p-type $Al_{0.3}Ga_{0.7}As$ having the same p-type carrier concentration of respective thicknesses of 64.5 nm and 57.6 nm, wherein only the lowest layer of the p-type $Al_{0.3}Ga_{0.7}As$ layers was replaced by one p-type $Al_{0.98}Ga_{0.02}As$ layer 7 having a carrier concentration of $1\times10^{18}/cm^3$; and a p-type contact layer 9 having a p-type carrier concentration of $3\times10^{18}/cm^3$ and a thickness of 9.0 nm.

Thereafter, a region in the vicinity of the bottom surface of the concavity 2 on the surface of the element was filled with resist and the other regions than that in the vicinity of the bottom surface were removed by a depth in the order of 8 $\mu$m by wet etching to expose the n-type contact layer, which is the lower side contact layer. Since this layer is made of a GaAs layer, it has a slow etching rate, so that it works as an etching stopper layer. The surface of the laser is heated in a water vapor atmosphere at 400° C. for 5 min. Thereby, the $Al_{0.98}Ga_{0.02}As$ layer is subject to oxidation due to its aluminum rich content and a high speed oxidation is selectively advanced inwardly from the circumference, so that an aluminum oxide layer 11 is formed on the bottom surface of the concavity 2 except in a regular triangle shaped region having a side of 5 $\mu$m in the bottom surface, as shown in FIG. 5.

This aluminum oxide layer 11 has features that it has a high degree of a insulating property but a low refractive index. It is possible to make a current flow only in the region in the shape of a regular triangle having a side of 5 $\mu$m and thereby a good current constriction can be realized. Furthermore, since it has a low refractive index, it is possible to confine light and thereby an index wave guide, which shows an effective index guiding property in a light oscillating direction, can be formed.

In this embodiment, the $Al_{0.98}Ga_{0.02}As$ layer 11 to be oxidized is inserted as the lowest layer of the upper semiconductor multilayer reflecting film 8, but alternatively it may be inserted in the lower semiconductor multilayer reflecting film 4.

Figure 6:
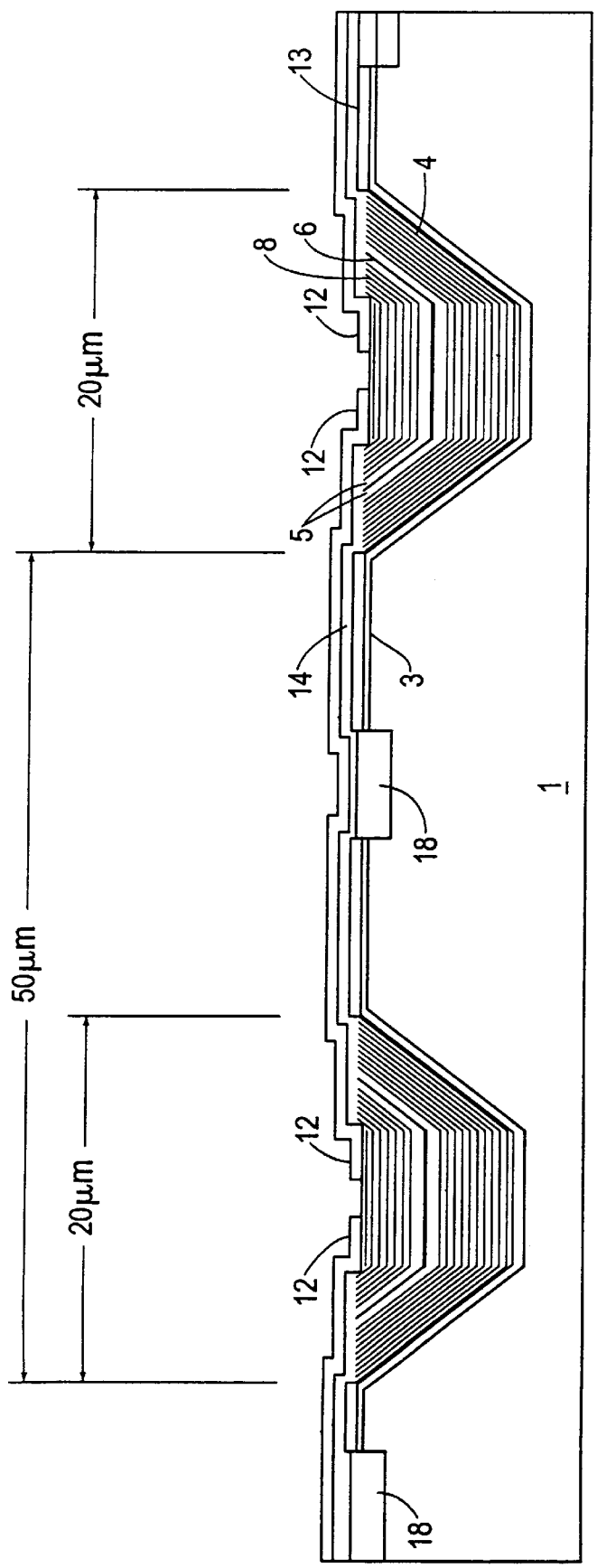
FIG. 6 is a view showing a semiconductor laser according to a fifth embodiment of the present invention.
Figure 7:
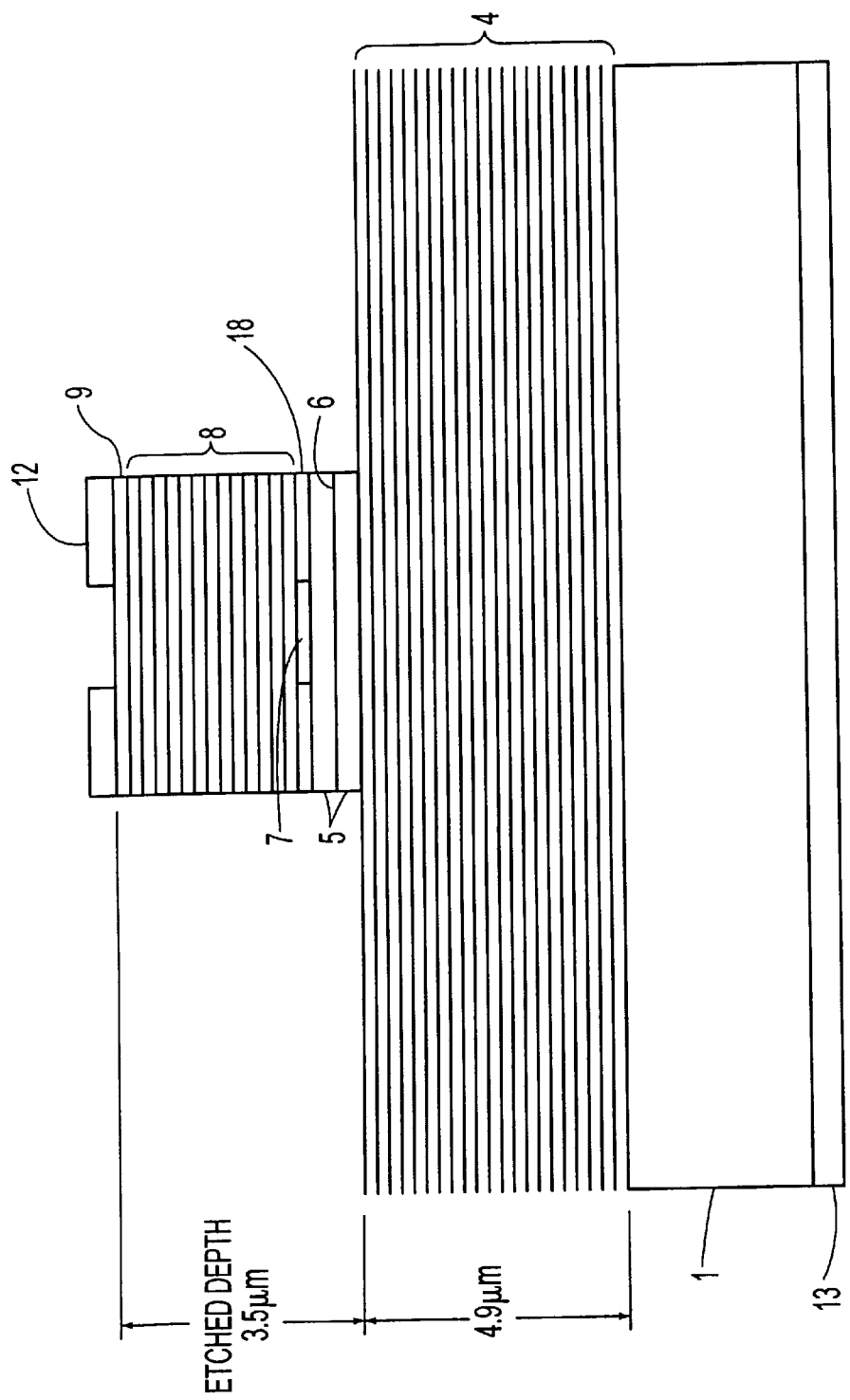
FIG. 7 is a view showing a conventional semiconductor laser.
Figure 8:
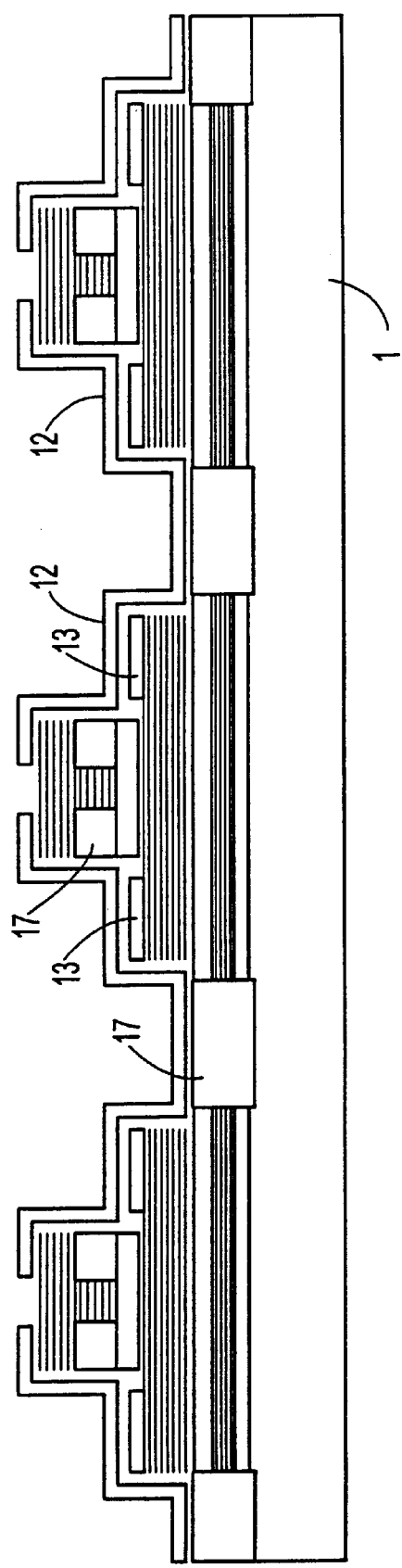
FIG. 8 is a view showing a conventional semiconductor laser.

A surface emitting semiconductor laser array having matrix interconnection as the fifth embodiment of the present invention will be described. As shown in FIG. 6, concavities each having a square bottom surface of a side of 20 $\mu$m are two dimensionally formed on a surface of a semi-insulating (100) oriented GaAs substrate 16, in the same way as that of the fourth embodiment, the $Al_{0.98}Ga_{0.02}As$ layer 7 to be selectively oxidized is inserted as the lowest layer of the upper semiconductor multilayer reflecting film 8 and the surface emitting semiconductor laser is fabricated in a buried manner in the concavity. In this structure, there are features that a protruding region from the concavity is removed by etching, semiconductor layers around the concavity are removed by etching to expose the n-type contact layer and thereafter proton implantation is conducted between each set of laser arrays to form an ion implanted region 18 for isolation between elements by interposing insulation. It is only required that a depth of the ion implantation is of the order that an ion penetrates through the n-type contact layer 3 and since the thickness of the n-type contact layer is as thin as about 0.3 $\mu$, the implantation can be performed with ease.

A structure in the concavity 2 is formed in the same way as that of the previous embodiment, a n-side electrode interconnection 13 is disposed in parallel to the ion implanted region 18, an interlayer insulating film 14 made of a silicon oxide film having a thickness of the order of 0.2 $\mu$m is formed as an upper layer thereon, a p-side electrode interconnection 12 is formed as an upper layer thereon along a direction perpendicular to the n-side electrode interconnection 13 and the p-side electrode interconnection is subjected to an ohmic contact with the p-side contact layer 9 located on the surface of a buried region.

In such a way, a high density interconnection with an extremely high accuracy can be formed with ease.

While respective semiconductor layers were formed by means of a metalorganic chemical vapor deposition method, the method is not exclusively used and instead a molecular beam epitaxy (MBE) method may be used.

While, in the previous embodiment, a silicon oxide film was used as the interlayer insulating film 13, a silicon nitride film or any of other insulating films may be used instead.

While, in the previous embodiment, for example, a proton may be used as an ion to be implanted for element isolation, the invention is not limited to the proton but a nitrogen ion, and an oxygen ion and may of the other ionic species may be used such that a semiconductor layer is transformed to be of high resistivity.

In addition, while, in the previous embodiment, a semi-insulating substrate was used as a substrate, a method may be employed in which a semiconductor substrate is used, a semiconductor laser is formed on an inner wall of the concavity with an insulating layer made of an aluminum oxide film or the like interposing therebetween to isolate the substrate from the semiconductor laser region. In this arrangement, the laser can be actuated independently from a potential of the substrate, so that elements of other kinds can be integrated together, insulating isolation between lasers is perfect and formation of insulated regions by ion implantation is unnecessary.

Besides, while, in the previous embodiment, a sulfuric acid and hydrogen peroxide solution and anisotropic etching, which has a dependency on a crystallographic orientation, were used for formation of a concavity, there is no limitation to this combination but any proper modifications are possible, for example dry etching may be used instead.

In the case of employing wet etching, there can be formed a concavity comprising a sloped surface in such a manner that an opening is enlarged upwardly from the bottom surface. This sloped surface can be formed with a good controllability and thus a concavity of a high reproducibility in shape can be obtained. A good ohmic contact on the surface side can be achieved by using the sloped surface as a contact layer. On the other hand, in the case where dry etching such as a reactive ion beam etching (RIBE) method or a reactive ion etching (RIE) method is used, a sidewall of a concavity can be formed in a vertical or undercut profile, wherein as an etching gas, $Cl_2$, $BCl_3$, a mixture of Ar and $Cl_2$ or the like can be used.

In the previous embodiment, the case of an InGaAs base layer as a quantum well active layer has been described but a material is not limited to this, for example an AlGaAs or InGaAs base layer can also be used instead.

As has been described above, according to the present invention, since a structure that a surface emitting semiconductor laser is buried in a concavity, a surface profile with a small rise in a concavity and convexity can be obtained, so that electrode interconnection is formed with a great accuracy and a high reliability. Since electrode interconnection can be formed on a plane with a profile of a small rise in concavity and convexity, matrix interconnection of positive and negative electrodes, which has conventionally been difficult, can be performed with ease.

Since electrode interconnection can be formed on a plane with a profile of a small rise in concavity and convexity, it is made possible that disconnection, circuit short, wrong shape and the like of interconnection occurs with a greatly decreased probability.

Since there is no need for formation of electrode layers on a surface with a profile deep in concavity and convexity, etching thereof, formation of resist, film formation of an insulating film, etching thereof or the like is unnecessary. Thus no problems arise associated with residual resist, wrong formation of the insulating film, and the like, so that it is possible to form a two dimensional array with a high reliability.

Since a current constriction structure in which a current is concentrated in a quantum well layer at the bottom can be formed only by growing a laser structure on a crystal surface with a concavity, simplification of a process, shortening a process time, improvement of yield and reduction in cost can achieved.

Since p-side and n-side electrodes can be formed on the same surface as that of the substrate, electronic devices and optical devices can together be integrated.

In such a way, constriction of carrier to a quantum well active layer is well attained and thereby laser oscillation with a high efficiency and high characteristics can be obtained.

What is claimed is:

1. A surface emitting semiconductor laser array comprising:
    a plurality of concavities defined by a bottom surface of a predetermined area and sloped surfaces, which has a profile in such a manner that an area of an opening is larger toward the surface side from the bottom, said concavities being formed on a surface of a semiconductor substrate of a first conductivity type and two-dimensionally arrayed thereon, the bottom surface being completely surrounded by adjacent sloped surfaces;
    a plurality of surface emitting semiconductor lasers are formed in a buried manner in which a contact layer of the first conductivity type, a semiconductor multilayer reflecting film of the first conductivity type, a quantum well active layer having at least one quantum well structure, a semiconductor multilayer reflecting film of a second conductivity type, and a continuous contact layer of the second conductivity type are sequentially stacked in a layered manner in each of the concavities, a contact layer of the second conductivity type being buried in each concavity so that a surface of the contact layer of the second conductivity type is approximately flush with the surface of the semiconductor substrate;
    each of said contact layer of the first conductivity type located in a depth and made to reach the surface of part of the semiconductor substrate around the concavity while connected with a first electrode on the surface of said semiconductor substrate;
    said contact layer of the second conductivity type located at the surface of stacked layers in each concavity and connected to a second electrode formed on a part of the surface of the contact layer of the second conductivity type, other than a part left for forming a light guiding region; and
    said first and second electrodes of each surface emitting semiconductor laser respectively connected with an interconnection pattern on the surface of the substrate.

2. A surface emitting semiconductor laser array according to claim 1, wherein a contact layer of the first conductivity type is insulated in an insulating manner by proton implantation in each region between any adjacent concavities.

3. A surface emitting semiconductor laser array according to claim 1, wherein a semiconductor layer of a lower refractive index than the average refractive index of the semiconductor multilayer reflecting film of the first conductivity type is interposed at the lower layer side than the quantum well active layer in the concavity on the surface of the substrate and an effective refractive indexes in upward and downward directions of the bottom in the concavity are larger than those of a sloped surface of the concavity to form a light guiding structure.

4. A surface emitting semiconductor laser array according to claim 1, wherein an $Al_xM_{1-x}As$ (M: a group 3 element, $x \geq 0.9$) layer interposed in the semiconductor multilayer reflecting film or disposed in the vicinity thereof is formed so as to reach from its depth in the concavity to the surface of the semiconductor substrate and to further have part thereof exposed on the surface of the semiconductor and said $Al_xM_{1-x}As$ layer has a region of an insulating property having a low refractive index formed by being subjected to selective oxidation.

5. A surface emitting semiconductor laser array according to claim 1, wherein the semiconductor substrate is a semi-insulating substrate, a contact layer of the first conductivity type is disposed on the lower side of the semiconductor multilayer reflecting film of the first conductivity type in the concavity on the surface of the semiconductor substrate or interposed in the semiconductor multilayer reflecting film and the contact layer of the first conductivity type is formed so as to reach from its depth in a part of the concavity to the surface of the semiconductor substrate around the concavity and said semiconductor laser array further comprises a first electrode stacked in a layered manner so as to be connected to the contact layer of the first conductivity type on the surface of the semiconductor substrate.

6. A surface emitting semiconductor laser array according to claim 1, wherein the semiconductor laser layers are buried in the concavity with an insulating layer formed along the inner sidewall of the concavity interposing therebetween and the semiconductor substrate and semiconductor laser layers are isolated by insulation from each other.

7. A surface emitting semiconductor laser array according to claim 6, wherein the insulating layer is an aluminum oxide layer formed by oxidation of an AlAs layer of AlGaAs layer.

8. A method of producing a surface emitting semiconductor laser comprising:

forming a concavity on a substrate, said concavity having a bottom surface completely surrounded by sloped surfaces;

forming a semiconductor multilayer reflecting film of a first conductivity type;

forming a quantum well active layer having at least a quantum well structure;

forming a semiconductor multilayer reflecting film of a second conductivity type;

forming a continuous contact layer of the second conductivity type, said films and layers being sequentially stacked in a layered manner inside the concavity formed on a surface of a semiconductor substrate and said contact layer of the second conductivity being embedded so that the surface thereof is substantially flush with the surface of said semiconductor substrate; and forming a second electrode on a part of the surface of said contact layer of the second conductivity type located at the surface of stacked layers in the concavity other than a part left for forming a light guiding region thereon.

9. A method of producing a surface emitting semiconductor laser of claim 8, wherein the concavity is defined by a bottom surface of a predetermined area and a sloped surface which as a profile in such a manner that an area of an opening is larger toward the surface side from the bottom.

10. A method of producing a surface emitting semiconductor laser of claim 8, wherein the concavity is formed in such conditions that etching is selectively conducted in dependence on a crystallographic orientation of the semiconductor substrate, the etching being anisotropic etching which controls so that the sloped surface constitutes a specific crystallographic plane.

11. A method of producing a surface emitting semiconductor laser according to claim 8, wherein the semiconductor substrate is (100)-oriented GaAs substrate or (111)A-oriented GaAs substrate and etching is an anisotropic etching step controlling so that the sloped surface may be a (111)A-oriented plane.

* * * * *